United States Patent [19]

Kawakami

[11] 4,357,712
[45] Nov. 2, 1982

[54] RADIO RECEIVER

[75] Inventor: Yasushi Kawakami, Tokyo, Japan

[73] Assignee: Nissan Motor Company, Limited, Yokohama, Japan

[21] Appl. No.: 143,921

[22] Filed: Apr. 25, 1980

[30] Foreign Application Priority Data

Apr. 26, 1979 [JP] Japan .................................. 54-50871

[51] Int. Cl.³ .............................................. H03J 7/18
[52] U.S. Cl. .................................... 455/161; 455/254
[58] Field of Search ............... 455/161, 164, 165, 166, 455/168, 169, 254, 162

[56] References Cited

U.S. PATENT DOCUMENTS

| 2,572,926 | 10/1951 | Gull | 455/166 |
| 2,731,556 | 1/1956 | Wiley | 455/254 |
| 2,977,467 | 3/1961 | Black | 455/169 |
| 3,531,724 | 9/1970 | Fathauer | 455/161 |
| 3,571,724 | 3/1971 | Borg | 455/169 |
| 3,794,925 | 2/1974 | Imazeki . | |
| 3,855,535 | 12/1974 | Marsh, Jr. | 455/169 |
| 4,156,196 | 5/1979 | Someno et al. | 455/169 |

FOREIGN PATENT DOCUMENTS

| 2746282 | 4/1979 | Fed. Rep. of Germany . |
| 2246124 | 4/1975 | France . |
| 2406348 | 5/1979 | France . |
| 1024258 | 3/1966 | United Kingdom . |
| 1477675 | 6/1977 | United Kingdom . |

*Primary Examiner*—Marc E. Bookbinder

[57] ABSTRACT

In a radio receiver provided with an automatic tuning circuit, a tuning sensitivity adjusting circuit comprises a buffer which extracts a signal received partially-processed from the radio circuit without substantially affecting the audio output, and a change-over circuit which receives the signal from the extracting means, selectively attenuates the signal, and supplies the signal to the automatic tuning circuit as a signal to lock the tuning circuit to a desired signal.

2 Claims, 5 Drawing Figures

RADIO RECEIVER

BACKGROUND OF THE INVENTION

The present invention relates to a radio receiver, and, more particularly, to a radio receiver which has an automatic station-seeking device, for use with an automotive vehicle.

Generally, a radio receiver for an automotive vehicle is provided with a switch which is provided at the output stage of an antenna so as to have a simple circuit structure and which switches the receiving sensitivity in order to avoid interference from nearby stations.

On the other hand, in a radio receiver having an automatic station-seeking device, the station frequency sought is locked by reception of the broadcasting signal. If the reception sensitivity which is used for locking the station frequency is constant when the signal strength is relatively strong, a relatively weak broadcasting signal can be sought. It is very often desired, however, to receive only a relatively strong broadcasting signal in order to get good reception. FIG. 1 shows a typical conventional system for a radio receiver for an automotive vehicle, in which in order to allow the sensitivity of locking the station frequency to be decreased, a change-over switch SW, provided between an antenna 1 and a tuning circuit 2, is switched to the side of an attenuating resistor Rz thereby decreasing the reception sensitivity.

That is, if the switch SW is switched to the side of the resistor Rz, the broadcasting signal, which is reproduced from a speaker 8 through a tuning section consisting of the tuning circuit 2 and a mixer 3, an intermediate frequency amplifier 4, an amplitude limiter 5, a detector 6 and an audio-amplifier 7, is decreased in sensitivity. Simultaneously, what is called a station locking signal which is taken from the input side of the intermediate frequency amplifier 4 to stop sweeping of the automatic tuning circuit 10 in an automatic station-seeking device 9 is also decreased in sensitivity. As a result, if automatic tuning is started with a relatively strong signal, with the frequency sweep control of a phase-locked oscillator 12, by pressing down an automatic tuning key 11, the receiver will not lock on to a station frequency of which the signal received is insufficient to reproduce well, but will only lock on to a received tuned signal which is sufficiently strong to reproduce well. A memory 13 in the automatic station-seeking device 9 stores the frequency information of broadcast signals and directly sets the frequency information in the phase-locked oscillator 12 by a read operation when it is required to find a station.

When during driving of an automotive vehicle, a broadcast is being received using automatic tuning with the receiver sensitivity decreased by operating the switch SW so that the sensitivity of locking on to a station frequency is lowered, good reception is possible so long as the signal strength does not fluctuate. However, if the signal is attenuated, as for example by obstructions such as large buildings, the reproduced output of the received signal is greatly lowered. This attenuation in combination with the lowering of the reception sensitivity can seriously impair the signal to noise ratio.

SUMMARY OF THE INVENTION

It is therefore an object of the present invention to provide a radio receiver for automotive vehicles, wherein the received signal applied to an automatic station-seeking device in order to tune the tuning section to the received signal is taken out without affecting the received signal which is finally transformed to an audible sound.

Another object of the present invention is to provide a radio receiver for automotive vehicles wherein a decrease in signal to noise ratio caused by a decrease in the reproduced output is avoided thereby bringing about satisfactory reception of a desired broadcast frequency.

According to the present invention, there is provided, in a radio receiver provided with an automatic tuning circuit, a tuning sensitivity adjusting circuit comprising; means for extracting a partially-processed received signal from a point in the radio circuit without substantially affecting the audio output from the receiver; and a change-over circuit for receiving the signal from the extracting means, selectively attenuating the received signal, and supplying the received signal to the automatic tuning circuit as a signal to lock the tuning circuit to the tuning frequency.

BRIEF DESCRIPTION OF THE DRAWINGS

Other objects, features and advantages of the present invention will be more apparent from the following description, taken in conjunction with the accompanying drawings in which.

DETAILED DESCRIPTION OF THE PREFERRED EMBODIMENT

Figure 1:
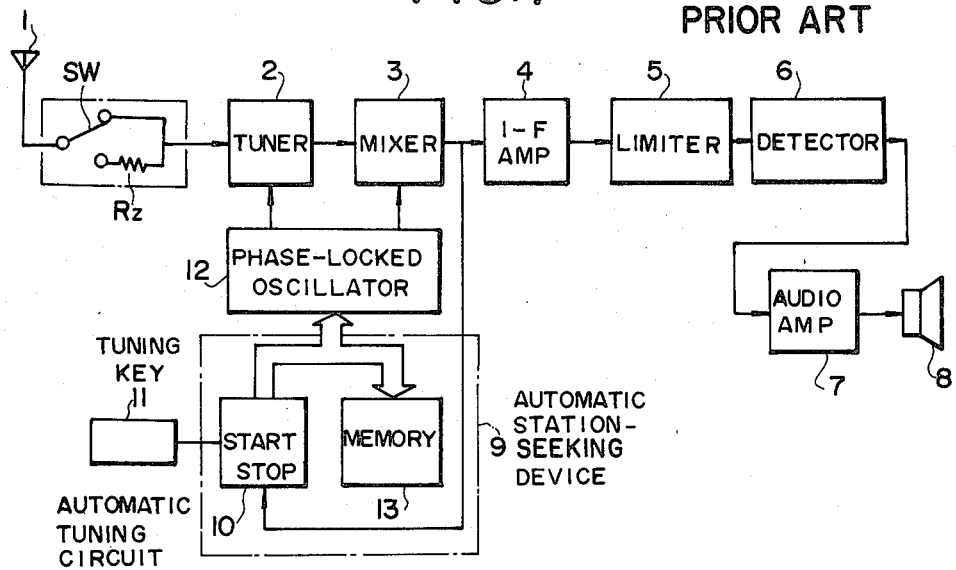
FIG. 1 is a block diagram of a prior art radio receiver.
Figure 2:
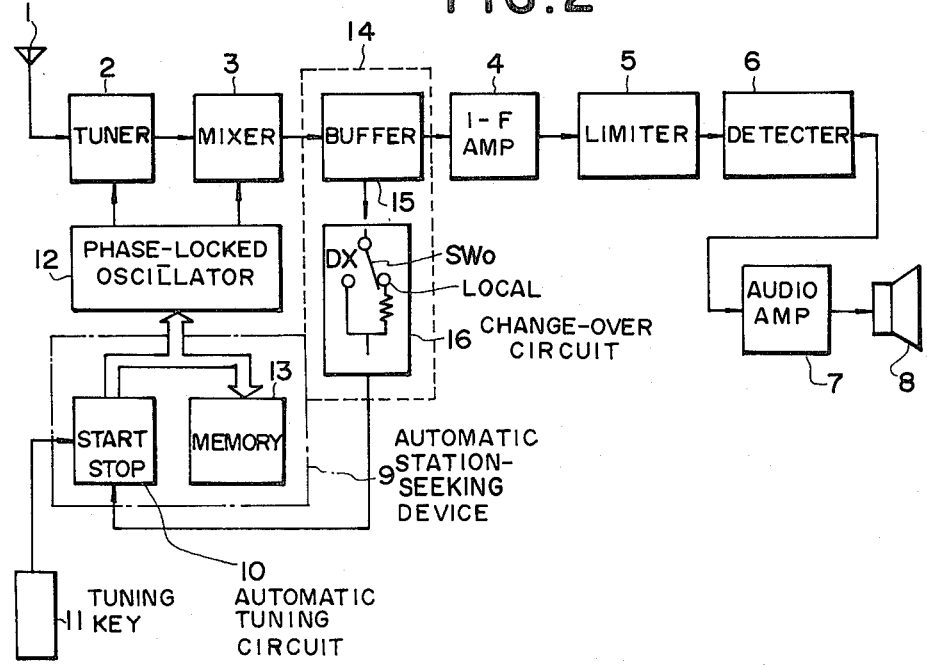
FIG. 2 is a block diagram of a preferred embodiment of a radio receiver according to the present invention.

In FIG. 2 is shown a preferred embodiment of a radio receiver according to the present invention. Provided at the output stage of tuning section, i.e., between the mixer 3 and the intermediate frequency amplifier 4 is a circuit 14. This circuit consists of a buffer 15 which extracts partially-processed received signal, and a change-over circuit 16 which applies the received signal either directly or attenuated to the automatic tuning circuit 10 of the automatic station-seeking device 9, as a signal to stop the sweeping of the tuning section over the frequency spectrum. This signal is referred to hereinafter as the "station locking signal." The structure of the FIG. 2 radio receiver is the same as that of the FIG. 1 radio receiver except for the circuit 14. The same reference numeraly denotes corresponding elements through the drawings. The buffer 15 may be a transistor buffer, such as is well known in the art, because it must match the mixer 3 in impedance to the intermediate frequency amplifier 4 and the change-over circuit 16 and because it must deliver the signal from the mixer 3 to two circuits without attenuation. The change-over circuit 16 includes a change-over switch $SW_0$ which has two positions. When the switch $SW_0$ is in the low sensitivity position, indicated as "LOCAL," the separated received signal is attenuated. Irrespective of the position of the switch $SW_0$, the received signal applied to the intermediate frequency circuit 4 is not attenuated;

thus the operation of the switch $SW_0$ does not affect reception sensitivity.

Figure 3:
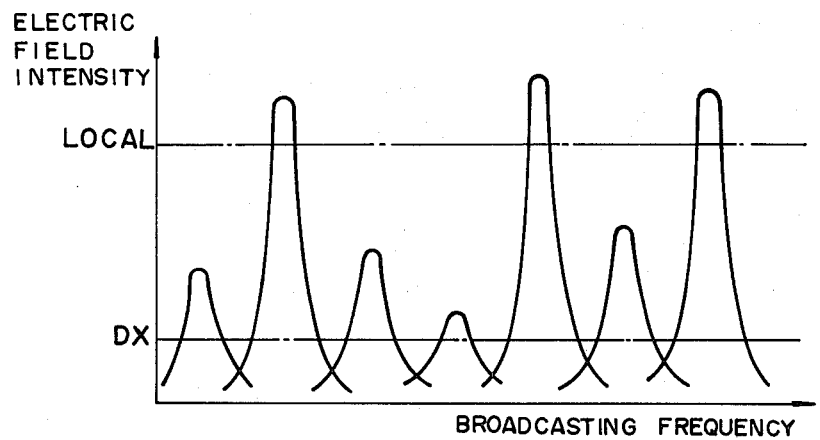
FIG. 3 is a graph showing the signal strengths of broadcast frequencies and the threshold levels of sensitivity for locking on to a station.

FIG. 3 shows an example graph of signal strength at the receiver against frequency, with the high and low sensitivity threshold levels indicated by "DX" and "LOCAL" respectively. It will be seen that in this example, in the high sensitivity setting, seven stations can be tuned to, but in the low sensitivity setting the automatic tuning circuit will lock on to only the three strongest stations.

Figure 4:
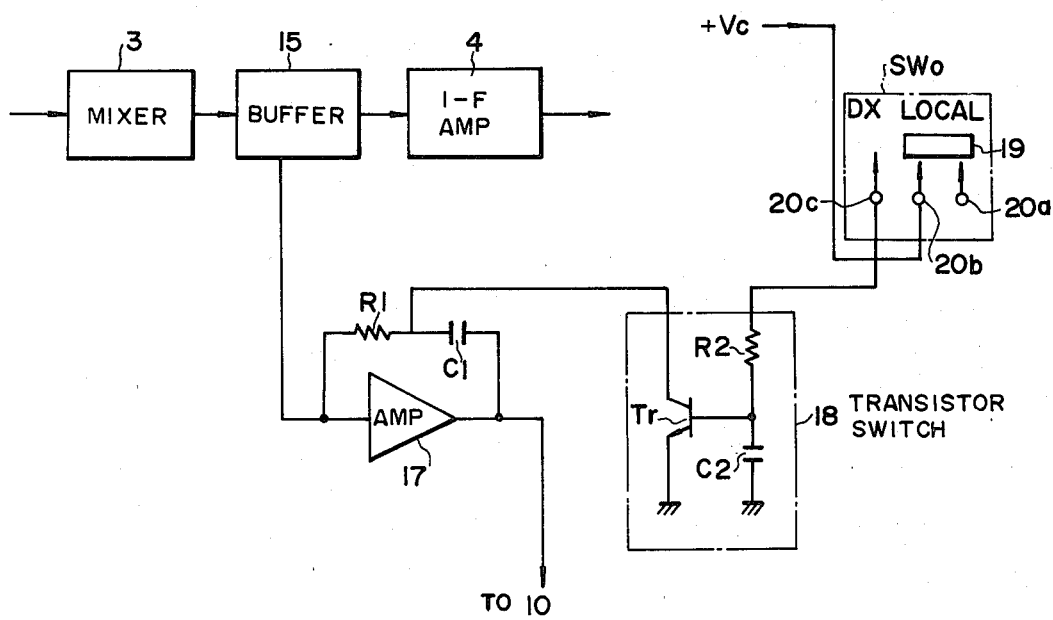
FIG. 4 is a diagram of a circuit used in the FIG. 2 embodiment, which extracts a signal for locking on to a station.

FIG. 4 shows details of the circuit 14 in FIG. 2. The received signal is extracted by the buffer 15 and taken out through a controlled gain amplifier 17, as a signal for locking to a station. The amplifier 17 has a negative feedback circuit which includes a resistor $R_1$ and a capacitor $C_1$ connected in series. The degree of negative feedback is controlled by a transistor switch 18, thereby changing the amplification gain of the received signal fed to the automatic tuning circuit 10. The transistor switch 18 is controlled by the change-over switch $SW_0$ so as to be switched on and off. When a movable member 19 is moved to the side of a low sensitivity terminal 20a, as shown in FIG. 4, the transistor switch 18 is turned off, while when the movable member 19 is moved to the side of a high sensitivity terminal 20c, the power supply $+V_c$ is applied from a common terminal 20b to a transistor $T_r$ through an integrating circuit consisting of a resistor $R_2$ and a capacitor $C_2$, thereby switching on the transistor switch 18 after a certain time delay.

When the switch $SW_0$ is changed over to the low sensitivity on the LOCAL side, the transistor switch 18 is in the off state, and the received signal is taken out from the amplifier 17 as a signal to lock to a station, with amplification gain $G_1$ determined by the degree of negative feedback, which is in turn determined by the resistor $R_1$ and the capacitor $C_1$. At this time, the tuning will lock only to the broadcast frequencies whose signal strengths exceed the LOCAL level in FIG. 3. On the other hand, when the switch $SW_0$ is changed over to the side of high sensitivity, i.e. DX, the transistor switch 13 is turned on and the junction between the resistor $R_1$ and capacitor $C_1$ is grounded. This increases the amplification gain of the controlled gain amplifier 17 from $G_1$ to $G_2$ so that the received signal taken out is increased in level compared with that when the switch $SW_0$ is on the side of low sensitivity. As a result, the tuning will lock on to any broadcast frequencies whose signal strengths exceed the FIG. 3 DX level.

As will be seen from the above, in the particular embodiment of FIG. 4, the amplification gain of the received signal extracted by the buffer 15, i.e., the sensitivity of tuning, is positively controlled by the change-over switch $SW_0$. Since the signal to the controlled gain amplifier 17 is separately processed after being separated through the buffer 15, the signal to the intermediate frequency amplifier 4 is not affected by changing over the output level of the signal which locks to a station frequency; the reception sensitivity itself is not changed at all. The combination of the gain control amplifier 17 and the negative feedback circuit thereof is illustrated as one example only, and other appropriate combinations will occur to those skilled in the art.

Figure 5:
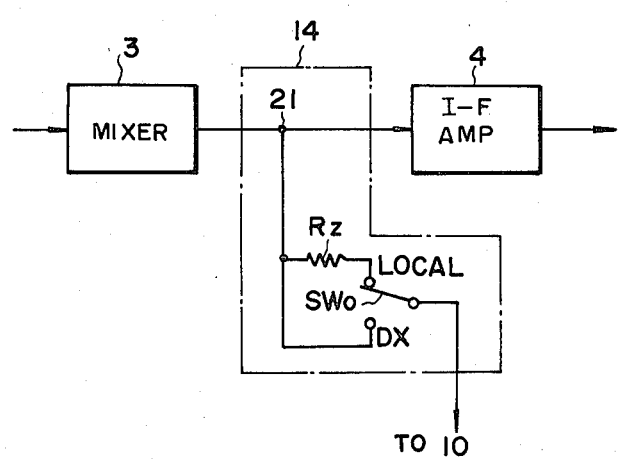
FIG. 5 is a modification of the FIG. 4 circuit.

In FIG. 5, a modification of the circuit 14 used in the FIGS. 2 and 4 is shown. The circuit 14, provided between the mixer 3 and the intermediate frequency amplifier 4, extracts the signal from the mixer 3 at the junction 21 and applies it to the change-over switch $SW_0$. This switch has two positions, LOCAL and DX; the received signal is applied through an attenuating resistor $R_z$ to the LOCAL terminal, and the signal is directly applied to the DX terminal. The signal is taken out as a signal to lock to a station frequency from a common terminal to the automatic tuning circuit 10.

Accordingly, if the switch $SW_0$ is changed over to the LOCAL position for automatically seeking a station frequency when the signal strength is high, such as at night, the received signal will be attenuated by the resistor $R_0$ and, as a result, its level lowered, with the result that automatic tuning is effected only to broadcast frequencies whose signal strength exceeds the LOCAL level shown in FIG. 3. Although the switch $SW_0$ is in the LOCAL position, the received signal to the intermediate frequency amplifier 4 is not attenuated, and the reproduced sound from the speaker is not affected by the circuit 14 which extracts the signal to lock to the station frequency.

In the above embodiment and modification thereof, the circuit 14 which extracts a signal to lock to a station frequency is shown as being provided between the mixer 3 and the intermediate frequency amplifier 4, but the invention is not limited to this particular arrangement. The circuit 14 may be provided in a circuit section after the tuning section, where a change in the received electric field appears in the received signal. The present invention is also applicable to a radio receiver wherein the tuning section is tuned mechanically by a motor or the like, instead of the electronic tuning mentioned above.

As described above, according to the radio receiver of the present invention used in an automotive vehicle, the levels of the received signals applied to the automatic station-seeking device are changed without affecting the levels of the signals supplied to the amplifier stages. Thus when the vehicle drives through an area in which the signal strengths of broadcast waves fluctuate, a decrease in signal to noise ratio due to a decrease in the reproduction output is avoided and, as a result, satisfactory reception of a desired broadcast signal is possible.

While the present invention has been particularly shown and described with reference to a preferred embodiment and a modification thereof, it will be understood by those skilled in the art that the foregoing and other changes in form and details may be made therein without departing from the spirit and scope of the present invention.

What is claimed is:

1. In a radio receiver provided with an automatic tuning circuit for locking the radio receiver onto the frequency of a received signal, a tuning sensitivity adjusting circuit comprising:
   means for extracting a partially-processed received signal from the radio receiver without substantially affecting the output of the radio receiver;
   a gain selecting change-over circuit, responsive to the partially-processed signal from said extracting means, for selectably amplifying the partially-processed signal at a selected first one of a plurality of gain levels, and for outputting the selectably amplified signal to the automatic tuning circuit as a station-locking signal; and
   a time-delay circuit provided in the change-over circuit for delaying for a predetermined time application of a selectably amplified signal at a selected second gain level as said station locking signal in response to said changeover circuit selecting said second gain level.

2. The tuning sensitivity adjusting circuit of claim 1, wherein said change-over circuit comprises a switching circuit having switch positions corresponding to at least two signal gain levels, and an operational amplifier circuit responsive to the switching circuit to amplify the partially-processed signal at different gains for each of the switch positions, and wherein said time-delay circuit is responsive to the switching circuit to delay the output of the operational amplifier circuit by a predetermined time when the switch positions of the switching circuit are changed from one to another.

* * * * *